United States Patent
Rizzo

(10) Patent No.: US 7,502,253 B2
(45) Date of Patent: Mar. 10, 2009

(54) SPIN-TRANSFER BASED MRAM WITH REDUCED CRITICAL CURRENT DENSITY

(75) Inventor: Nicholas D. Rizzo, Gilbert, AZ (US)

(73) Assignee: EverSpin Technologies, Inc., Chandler, AZ (US)

( * ) Notice: Subject to any disclaimer, the term of this patent is extended or adjusted under 35 U.S.C. 154(b) by 313 days.

(21) Appl. No.: 11/511,691

(22) Filed: Aug. 28, 2006

(65) Prior Publication Data

US 2008/0049488 A1 Feb. 28, 2008

(51) Int. Cl.
*G11C 11/14* (2006.01)

(52) U.S. Cl. .................... 365/171; 365/173; 365/158

(58) Field of Classification Search .................. 365/171, 365/173, 158
See application file for complete search history.

(56) References Cited

U.S. PATENT DOCUMENTS

| | | | |
|---|---|---|---|
| 6,532,164 B2 * | 3/2003 | Redon et al. ................... 365/97 |
| 6,829,121 B2 * | 12/2004 | Ikeda et al. .............. 428/811.5 |
| 6,967,863 B2 | 11/2005 | Huai |
| 7,099,184 B2 * | 8/2006 | Sugibayashi et al. ........ 365/158 |
| 7,420,839 B2 * | 8/2008 | Ikeda et al. ................. 365/173 |
| 2006/0087880 A1 | 4/2006 | Mancoff |

FOREIGN PATENT DOCUMENTS

WO    WO 2005/082061 A2    9/2005

* cited by examiner

*Primary Examiner*—Tuan T. Nguyen
(74) *Attorney, Agent, or Firm*—Ingrassia Fisher & Lorenz, P.C.

(57) ABSTRACT

A magnetic random access memory device include a spin torque MRAM cell (100) having a reduced switching current ($I_c$) wherein standard materials may be used for a free layer (108). A fixed magnetic element (112) polarizes electrons passing therethrough, and the free magnetic element (108) having a first plane anisotropy comprises a first magnetization (130) whose direction is varied by the spin torque of the polarized electrons. An insulator (110) is positioned between the fixed magnetic element (112) and the free magnetic element (108), and a keeper layer (104) positioned contiguous to the free magnetic element (108) and having a second plane anisotropy orthogonal to the first plane anisotropy, reduces the first plane anisotropy and hence reduces the spin torque switching current ($I_c$). The keeper layer (104) may include alternating synthetic antiferromagnetic layers (132, 134) of magnetization approximately equal in magnitude and opposite in direction.

17 Claims, 3 Drawing Sheets

SPIN-TRANSFER BASED MRAM WITH REDUCED CRITICAL CURRENT DENSITY

FIELD OF THE INVENTION

The present invention generally relates to magnetic random access memory ("MRAM") devices, and more particularly relates to spin-transfer based MRAM devices.

BACKGROUND OF THE INVENTION

MRAM is a nonvolatile memory technology that uses magnetization to represent stored data, in contrast to older RAM technologies that use electronic charges to store data. One primary benefit of MRAM is that it retains the stored data in the absence of electricity, i.e., it is a nonvolatile memory. Generally, MRAM includes a large number of magnetic cells formed on a semiconductor substrate, where each cell represents one data bit. A bit is written to a cell by changing the magnetization direction of a magnetic element within the cell, and a bit is read by measuring the resistance of the cell (low resistance typically represents a "0" bit and high resistance typically represents a "1" bit).

A practical MRAM device will typically include millions of cells. Generally, a single MRAM cell includes an upper ferromagnetic layer, a lower ferromagnetic layer, and an insulating layer between the two ferromagnetic layers. The upper ferromagnetic layer is the free magnetic layer because the direction of its magnetization can be switched to change the bit status of the cell. The lower ferromagnetic layer is the fixed magnetic layer because the direction of its magnetization does not change. When the magnetization in the upper ferromagnetic layer is parallel to the magnetization in the lower ferromagnetic layer, the resistance across the cell is relatively low. When the magnetization in the upper ferromagnetic layer is anti-parallel to the magnetization in the lower ferromagnetic layer, the resistance across the cell is relatively high. The data ("0" or "1") in a given cell is read by measuring the resistance of the cell. In this regard, electrical conductors attached to the cells are utilized to read the MRAM data.

The orientation of magnetization in the free magnetic layer can point in one of two opposite directions, while the orientation of the fixed magnetic layer can only point in one direction. In conventional MRAM, the orientation of the magnetization in the free magnetic layer rotates in response to current flowing in a digit line and in response to current flowing in a write line. Selecting the directions of the currents will cause the magnetization in the free magnetic layer to switch from parallel to anti-parallel to the magnetization in the fixed magnetic layer. In a typical MRAM, the orientation of the bit is switched by reversing the polarity of the current in the write line while keeping a constant polarity of the current in the digit line.

The traditional MRAM switching technique has some practical limitations, particularly when the design calls for scaling the bit cell to smaller dimensions. For example, since this technique requires two sets of magnetic field write lines, the array of MRAM cells is susceptible to bit disturbs (i.e., neighboring cells may be unintentionally altered in response to the write current directed to a given cell). Furthermore, decreasing the physical size of the MRAM free layer results in lower magnetic stability against magnetization switching due to thermal fluctuations. The stability of the bit can be enhanced by utilizing a magnetic material for the free layer with a large magnetic anisotropy and therefore a large switching field, but then the currents required to generate a magnetic field strong enough to switch the bit are impractical in real applications.

Transmission mode spin-transfer switching is another technique for writing MRAM bit data. Writing bits using the spin-transfer interaction can be desirable because bits with a large coercivity (Hc) in terms of magnetic field induced switching (close to 1000 Oersteds (Oe)) can be switched using only a modest current, e.g., less than 5 mA. The higher Hc results in greater thermal stability and less possibility for disturbs. A conventional transmission mode spin-transfer switching technique for an MRAM cell includes a first magnetic layer, a nonmagnetic tunnel barrier layer, and a second magnetic layer. In this technique, the write current actually flows through the tunnel junction in the cell. According to the spin-transfer effect, the electrons in the write current become spin-polarized after they pass through the fixed magnetic layer. In this regard, the fixed layer functions as a polarizer. The spin-polarized electrons cross the nonmagnetic layer and, through conservation of angular momentum, impart a torque on free magnetic layer. This torque causes the orientation of magnetization in the free magnetic layer to be parallel to the orientation of magnetization in the fixed magnetic layer. The parallel magnetizations will remain stable until a write current of opposite direction switches the orientation of magnetization in the free magnetic layer to be anti-parallel to the orientation of magnetization in the fixed magnetic layer.

The transmission mode spin-transfer switching technique requires relatively low power (compared to the conventional switching technique), virtually eliminates the problem of bit disturbs, results in improved data retention, and is desirable for small scale applications. In practice, however, this technique is difficult to implement in a memory array because the write current must flow through the magnetic tunnel junction embodied in the cell. This negatively affects the reliability of the MRAM cells and requires the use of larger write transistors at each bit location that are capable of producing the necessary currents, which is incompatible with high-density applications.

As disclosed in U.S. Patent Publication No. 2006/0087880 A1, a magnetic random access memory ("MRAM") device can be selectively written using spin-transfer reflection mode techniques. Selectivity of a designated MRAM cell within an MRAM array is achieved by the dependence of the spin-transfer switching current on the relative angle between the magnetizations of the polarizer element and the free magnetic element in the MRAM cell. The polarizer element has a variable magnetization that can be altered in response to the application of a current, e.g., a digit line current. When the magnetization of the polarizer element is in the natural default orientation, the data in the MRAM cell is preserved. When the magnetization of the polarizer element is switched, the data in the MRAM cell can be written in response to the application of a relatively low write current.

A technique is disclosed in U.S. Pat. No. 6,967,863 to reduce the critical current density for spin transfer by using a free layer with perpendicular anisotropy and out of plane magnetization. Another technique is disclosed in WIPO publication WO 2005/082061 A2 to reduce the critical current density for spin transfer by using a free layer with perpendicular anisotropy and in-plane magnetization.

However, these methods require specific materials for the free layer, which can negatively affect switching reliability and also the read signal.

Accordingly, it is desirable to provide a spin torque MRAM cell having a reduced switching current wherein standard materials may be used for the free layer. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The spin-transfer effect is known to those skilled in the art. Briefly, a current becomes spin-polarized after the electrons pass through the first magnetic layer in a magnet/non-magnet/magnet trilayer structure, where the first magnetic layer is substantially thicker than the second magnetic layer. The spin-polarized electrons cross the nonmagnetic spacer and then, through conservation of angular momentum, place a torque on the second magnetic layer, which switches the magnetic orientation of the second layer to be parallel to the magnetic orientation of the first layer. If a current of the opposite polarity is applied, the electrons instead pass first through the second magnetic layer. After crossing the nonmagnetic spacer, a torque is applied to the first magnetic layer. However, due to its larger thickness, the first magnetic layer does not switch. Simultaneously, a fraction of the electrons will then reflect off the first magnetic layer and travel back across the nonmagnetic spacer before interacting with the second magnetic layer. In this case, the spin-transfer torque acts so as to switch the magnetic orientation of the second layer to be anti-parallel to the magnetic orientation of the first layer. Spin-transfer as described so far involves transmission of the current across all layers in the structure. Another possibility is spin-transfer reflection mode switching. In reflection mode, the current again becomes spin-polarized as the electrons pass through the first magnetic layer. The electrons then cross the nonmagnetic spacer layer, but instead of also crossing the second magnetic layer, the electrons follow a lower resistance path through an additional conductor leading away from the interface between the nonmagnetic spacer and the second magnetic layer. In the process, some fraction of the electrons will reflect off this interface and thereby exert a spin-transfer torque on the second magnetic layer to align it parallel to the first magnetic layer.

In accordance with the exemplary embodiment described herein, a magnetic "keeper" layer with perpendicular anisotropy is positioned in close proximity to a free layer of a spin-torque MRAM to substantially cancel, or nullify, the surface anisotropy of the free layer, thereby reducing the spin torque switching current. Any material with perpendicular anisotropy can be used, including those with high damping constants and those with low magnetoresistance when used as a free layer.

Figure 1:
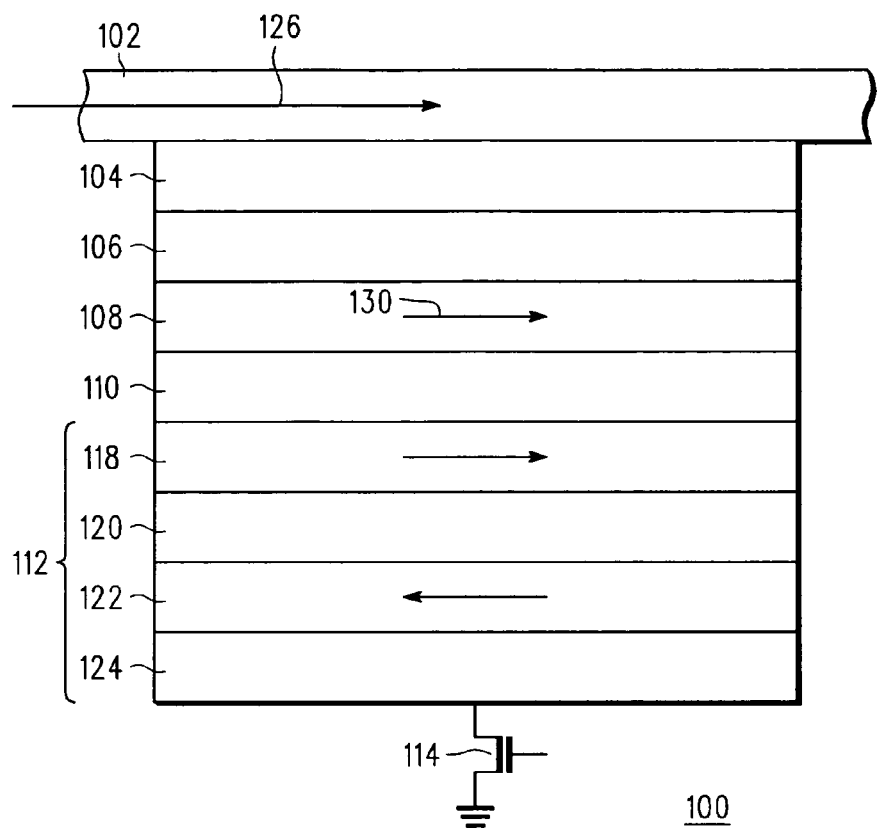
FIG. 1 is a side sectional view of an MRAM cell configured in accordance with an exemplary embodiment.

Referring to FIG. 1, a side sectional view of an MRAM cell 100 is configured in accordance with an exemplary embodiment. In practice, an MRAM architecture or device will include many MRAM cells 100, typically connected together in a matrix of columns and rows. MRAM cell 100 generally includes the following elements: a first conductor 102 which carries a write current 126; a keeper layer 104; an optional spacer element 106; a free magnetic element 108; an insulator 110; a fixed magnet element 112; and an isolation transistor 114. In this exemplary embodiment, fixed magnet element 112 includes a fixed magnetic layer 118, a spacer layer 120, a pinned magnetic layer 122, and an antiferromagnetic pinning layer 124. In a practical deployment, first conductor 102 may be connected to any number of similar MRAM cells (e.g., a column of cells) to provide a common write current 126 to each of the connected cells. The isolation transistor 114 is addressed when it is desired to write the cell 100 by providing a current therethrough from the first conductor 102 to the isolation transistor 114.

First conductor 102 is formed from any suitable material capable of conducting electricity. For example, first conductor 102 may be formed from at least one of the elements Al, Cu, Au, Ag, or their combinations.

A metal layer (not shown) may be formed between the keeper layer 104 and the first conductor 102 for providing an improved contact and for allowing polishing prior to forming the first conductor 102 without damaging the keeper layer 104. Any magnetic material, such as metal, with perpendicular anisotropy can be used for the keeper layer 104, including those with high damping constants. By not being part of the free layer 108, the keeper layer 104 may comprise multilayers of cobalt and platinum or cobalt and palladium, which could not be used in the previously known art mentioned in the Background of the Invention, due to their high damping constant which increases the spin torque switching current.

Spacer element 106 is located between keeper layer 104 and free magnetic element 108. Spacer element 106 is formed from an electrically conducting non-magnetic material, for example, Ta or other metallic materials.

The free magnetic element 108 is located between spacer element 106 and insulator 110. Free magnetic element 108 is formed from a magnetic material having a variable magnetization. For example, free magnetic element 108 may be formed from at least one of the elements Ni, Fe, Mn, Co, or their alloys as well as so-called half-metallic ferromagnets such as NiMnSb, PtMnSb, $Fe_3O_4$, or $CrO_2$. As with conventional MRAM devices, the direction of the variable magnetization of free magnetic element 108 determines whether MRAM cell 100 represents a "1" bit or a "0" bit. In practice, the direction of the magnetization of free magnetic element 108 is either parallel or anti-parallel to the direction of the magnetization of fixed magnet element 112.

Free magnetic element 108 has a magnetic easy axis that defines a natural or "default" orientation of its magnetization. When MRAM cell 100 is in a steady state condition with no write current 126 applied, the magnetization of free magnetic element 108 will naturally point along its easy axis. As described in more detail below, MRAM cell 100 is suitably configured to establish a particular easy axis direction for free magnetic element 108. From the perspective of FIG. 1, the easy axis of free magnetic element 108 points either to the right or to the left (for example, in the direction of the arrow 130). In practice, MRAM cell 100 utilizes anisotropy, such as shape or crystalline anisotropy, in free magnetic element 108 to achieve the orthogonal orientation of the respective easy axes.

In this exemplary embodiment, insulator 110 is located between free magnetic element 108 and fixed magnet element 112. More specifically, insulator 110 is located between free magnetic element 108 and fixed magnetic layer 118. Insulator 110 is formed from any suitable material that can function as an electrical insulator. For example, insulator 110 may be formed from a material such as oxides or nitrides of at least one of Al, Mg, Si, Hf, Sr, or Ti. For purposes of MRAM cell 100, insulator 110 serves as a magnetic tunnel barrier element, and the combination of free magnetic element 108, insulator 110, and fixed magnet element 112 form a magnetic tunnel junction.

In the illustrated embodiment, fixed magnet element 112 is located between insulator 110 and isolation transistor 114. Fixed magnet element 112 has a fixed magnetic layer 119 whose magnetization is either parallel or anti-parallel to the magnetization of free magnetic element 108. In the practical embodiment, fixed magnet element 112 is realized as a pinned synthetic antiferromagnet having fixed magnetic layer 118, spacer layer 120, pinned magnetic layer 122, and an antiferromagnetic layer 124. As depicted in FIG. 1, fixed magnetic layer 118 and pinned magnetic layer 122 have antiparallel magnetizations. Fixed magnetic layer 118 and pinned magnetic layer 122 may be formed from any suitable magnetic material, such as at least one of the elements Ni, Fe, Mn, Co, or their alloys as well as so-called half-metallic ferromagnets such as NiMnSb, PtMnSb, $Fe_3O_4$, or $CrO_2$. Antiferromagnetic layer 124 may comprise, for example, one of IrMn, NiMn, and FeMn, RhMn, or PtMn. Spacer layer 120 is formed from any suitable nonmagnetic material, including at least one of the elements Ru, Os, Re, Cr, Rh, Cu, or their combinations. Synthetic antiferromagnet structures are known to those skilled in the art and, therefore, will not be described in detail herein.

The isolation transistor 114 includes a first current electrode coupled to a voltage potential, a second current electrode coupled to the fixed magnetic layer 122 and a gate that, when selected, allows electrons to flow through the cell 100 to the first conductor 102.

In practice, MRAM cell 100 may employ alternative and/or additional elements, and one or more of the elements depicted in FIG. 1 may be realized as a composite structure or combination of sub-elements. The specific arrangement of layers shown in FIG. 1 merely represents one suitable embodiment of the invention.

In general, selection of the isolation transistor 114 allows for a writing current to flow through the cell 100 from the first conductor 102. The fixed magnetic element 112 polarizes the current, which programs the free layer 108. The keeper layer 104 positioned near (may be positioned adjacent in alternative embodiments) the free layer 108 cancels, or nullifies, the thin film surface anisotropy ($4\pi M_s$) of the free layer, thereby reducing the spin torque switching current.

The critical spin torque switching current for the free layer is known from the prior art to be:

$$I_c = \frac{\alpha e V M_s}{g\hbar}\left(H_k + \frac{1}{2}(4\pi M_s - H_{k\perp})\right)$$

where $\alpha$ is the Gilbert damping parameter, V is the free layer volume, $M_s$ is the free layer magnetization, g is the gyromagnetic ratio, $\hbar$ is Planck's constant, $H_k$ is the in-plane free layer anisotropy, and $H_{k\perp}$ is the out-of-plane free layer anisotropy. During a spin torque reversal, the spins are rotated out of plane against the in-plane anisotropy and the thin film surface anisotropy $4\pi M_s >> H_k$. Therefore, it is the surface anisotropy that limits the spin torque $I_c$. Prior art has shown that using a material with out-of-plane anisotropy $H_{k\perp}$ will assist rotating the spins out of plane and hence reduce the $4\pi M_s$ term and $I_c$, as the above formula shows. However, there are few materials that have large $H_{k\perp}$, low $\alpha$, reliable switching, and produce high magnetoresistance.

To reduce the $4\pi M_s$ term, the bit may be made thicker so that the out-of-plane demagnetizing field is small. The bit thickness needs to be comparable to it's width for this reduction to occur. However, for a thicker bit, V is also bigger so that $I_c$ is not reduced. The idea behind using the keeper layer 104 is to reduce or cancel the surface anisotropy without increasing V. The keeper layer 104 is in close proximity to the free layer 108 so that they are coupled magnetostatically, but are exchange decoupled by a thin, e.g., approximately 0.5-1.0 nm, nonmagnetic spacer layer 106. The keeper layer 104 is thick enough so that the out-of-plane demagnetizing field of the free layer 108 and keeper layer 104 combined is small. In addition, the keeper layer 104 has a perpendicular anisotropy $H_{k\perp}$, so that there is little energy cost for rotating the spins of the keeper layer 104 out-of-plane. Therefore, the keeper layer 104 reduces the surface anisotropy of the free layer 108 and hence $I_c$ is reduced.

Without the $H_{k\perp}$ in the keeper layer 104, there would be an energy cost for rotating the spins against the demagnetizing field, and $I_c$ would not be reduced. The magnitude of $H_{k\perp}$ is chosen so that it is slightly less than the out-of-plane demagnetizing field of the keeper layer 104. In this way, the magnetization of the keeper layer 104 remains in-plane.

Figure 2:
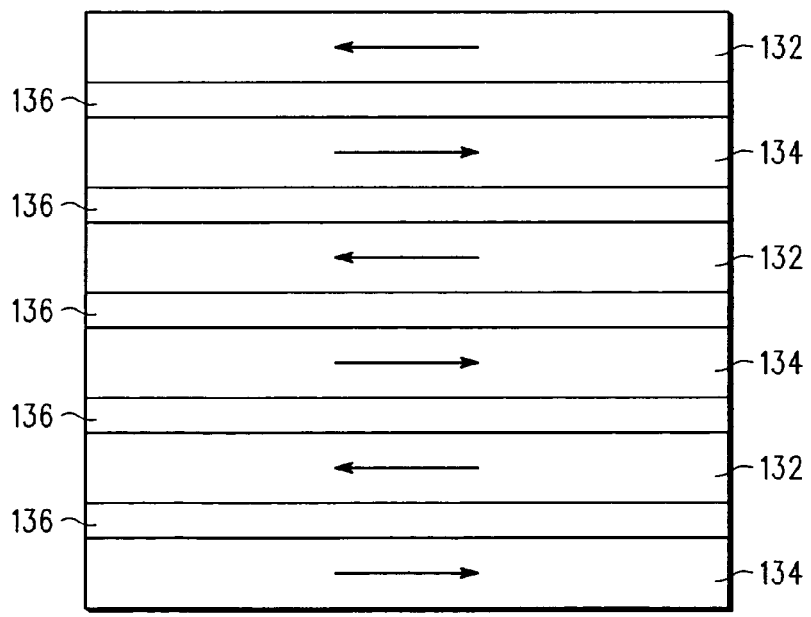
FIG. 2 is a side sectional view of a keeper layer of the MRAM cell of FIG. 1.

In one embodiment, the keeper layer 104 is patterned to the same approximate size as the free layer 108. Since the keeper layer 104 and free layers 108 are close enough to be coupled magnetostatically, a thick uniformly magnetized keeper layer 104 would produce an undesirable bias field on the free layer 108, making its switching asymmetric and unreliable. In addition, thick magnetic layers can also form uncontrollable vortex states when patterned. To eliminate the possibility of bias fields or vortex states, in the preferred embodiment, the keeper layer 104 is a synthetic antiferromagnetic multilayer (FIG. 2), where the magnetization of each layer 132 is approximately equal in magnitude and opposite in direction to the corresponding magnetic layer 134. The magnetic layers 132, 134 are optionally separated by spacer layers 136 that have antiferromagnetic exchange coupling. For example, such spacer layers 136 could be made of Ru, Os, Re, Cr, Rh, Cu, or combinations thereof. In another embodiment, the spacer layers 104 are nonmagnetic and the keeper layers 132, 134 align with antiparallel magnetization naturally as a result of dipolar field coupling at the ends of the keeper layers 132, 134. For example, such spacer layers 136 could be made of Ta, TaN, Ti, TiN, Al, AlN, W, or combinations thereof. For either type of spacer layer 136, its thickness is small enough, e.g., less than or equal to 1 nm, so that the magnetostatic coupling between the magnetic layers is still strong in the out-of-plane direction. The thickness of each magnetic layer will typically be 3.0 nm or more. The composition of the magnetic layers can be any layer with substantial $H_{k\perp}$, including, CoFeGd, CoFeTb, Co/Pd or Fe/Pd multilayers, Co/Pt or Fe/Pt multilayers, Co/Ni or Fe/Ni multi layers.

The other MRAM cells that share the first conductor 102 will not switch in response to the write current 126. Only the designated bit at the intersection of the specified write line (e.g., first conductor 102) and the selected isolation transistor 114 will be switched.

Figure 3:
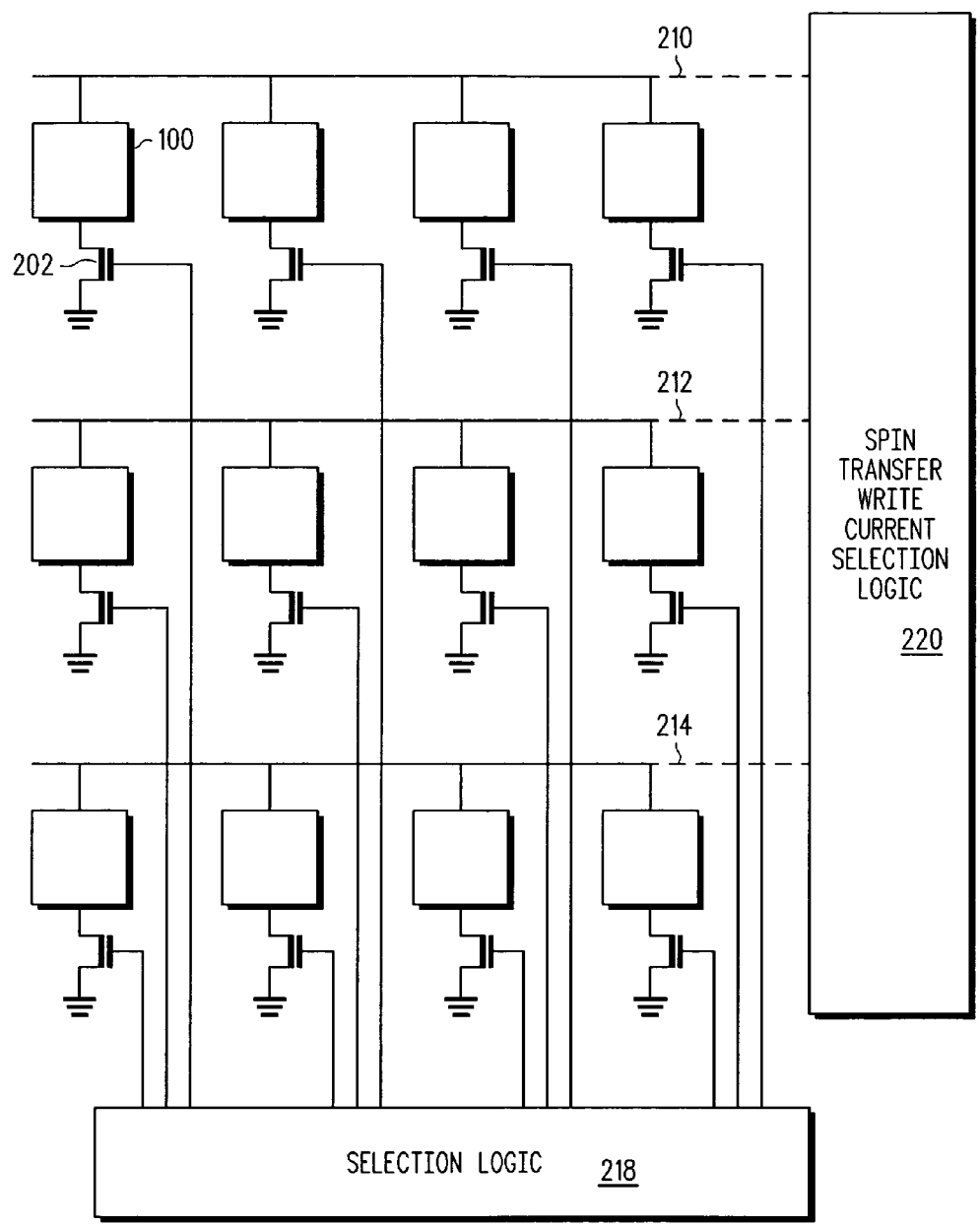
FIG. 3 is a schematic representation of an array of MRAM cells of FIG. 1.

A practical MRAM architecture may include an array or matrix of MRAM cells 100 having individual write selectivity as described herein. FIG. 3 is a schematic representation of an example MRAM array 200 that may employ any number of MRAM cells 100. The ellipses in FIG. 2 indicate that the MRAM array 200 can include any number of rows and any number of columns. In this example, each cell 100 is coupled to it's own isolation transistor 202, and cells 100 in a given row share a common write line 210, 212, and 214. MRAM array 200 includes logic 218 that controls the selection of isolation transistor 202, and logic 220 that controls the selection and/or application of current to the appropriate write line 210, 212, 214.

Figure 4:
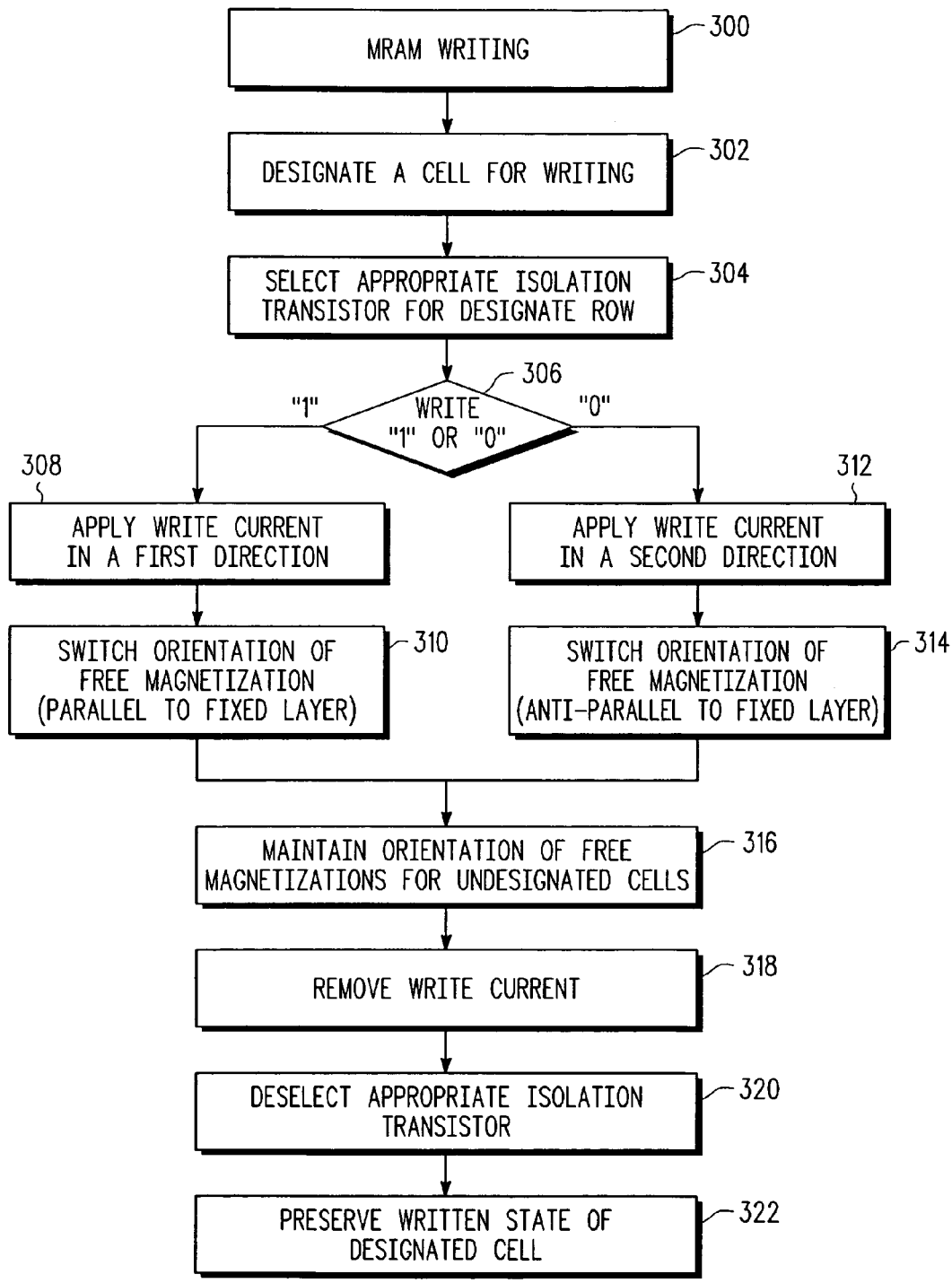
FIG. 4 is a flow chart of an MRAM writing process according to the exemplary embodiment.

FIG. 4 is a flow chart of an MRAM writing process 300 that may be performed when writing data to an MRAM array that includes MRAM cells 100 as described herein. Process 300 may be performed and/or controlled by one or more logic and/or processor elements (see, for example, FIG. 3) such as those found in computer systems. In a practical implementation, process 300 may include any number of additional and/or alternative tasks, and process 300 may be incorporated into a more complex memory control read/write procedure. Furthermore, the tasks depicted in process 300 need not be performed in the order shown in FIG. 4, and one or more of the tasks may be performed concurrently in a practical embodiment.

MRAM writing process 300 begins with a task 302, which designates an MRAM cell in the MRAM array for writing. In a typical "two dimensional" MRAM array, task 302 may identify a row and a column to designate the MRAM cell. Once the MRAM cell is designated, a write current is applied to a row of MRAM cells (task 304) by selecting isolation transistor 114; the current will pass through the bit in the designated MRAM cell.

If a "0" bit is to be written (query task 306), then MRAM writing process 300 applies a write current in a first direction to the designated MRAM cell (task 308); In response to the write current, the orientation of the magnetization for the free magnetic element in the designated MRAM cell is switched to a written state (task 310). The orientation of the magnetization for the free magnetic element in the designated MRAM cell is switched to become parallel to the orientation of the magnetization for the fixed magnetic element in the designated MRAM cell. The substantial cancellation by the keeper layer 104 of the surface anisotropy of the free layer 108 makes it possible to selectively write data to the designated MRAM cell using a smaller write current than known in the prior art.

If a "1" bit is to be written (query task 306), then MRAM writing process 300 applies a write current in a second direction to the designated MRAM cell (task 312). The orientation of the magnetization for the free magnetic element in the designated MRAM cell is switched to become anti-parallel to the orientation of the magnetization for the fixed magnetic element in the designated MRAM cell.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A magnetic random access memory device comprising:
a fixed magnetic element;
a free magnetic element having a first magnetization and a first anisotropy;
an insulator positioned between the fixed magnetic element and the free magnetic element; and
a keeper layer positioned contiguous to the free magnetic element and having a second anisotropy orthogonal to the first anisotropy.

2. The magnetic random access memory device of claim 1 wherein the keeper layer comprises a plurality of magnetic layers separated by nonmagnetic spacer layers.

3. The magnetic random access memory device of claim 2 wherein the magnetic layers comprise alternating layers of one of a) cobalt and platinum, and b) cobalt and palladium and c) cobalt and nickel.

4. The magnetic random access memory device of claim 2 wherein the magnetization of each magnetic layer is approximately equal in magnitude and opposite in direction to the magnetization of the adjacent magnetic layer.

5. The magnetic random access memory device of claim 2 wherein each spacer layer produces antiferromagnetic exchange coupling between the magnetic layers.

6. The magnetic random access memory device of claim 1 wherein the keeper layer is magnetostatically coupled, and exchange decoupled, from the free layer.

7. The magnetic random access memory device according to claim 1 further comprising a spin torque switching current that is reduced by the keeper layer.

8. The magnetic random access memory device according to claim 1 further comprising a spacer layer positioned between the keeper layer and the free magnetic element.

9. The magnetic random access memory device of claim 8 wherein the spacer layer comprises an electrically conducting non-magnetic material.

10. A magnetic random access memory device comprising:
a fixed magnetic element that polarizes electrons passing therethrough;
a free magnetic element having a first magnetization whose direction is varied by the spin torque of the polarized electrons, and having a first anisotropy;
an insulator positioned between the fixed magnetic element and the free magnetic element; and
a keeper layer positioned contiguous to the free magnetic element that reduces the first anisotropy, the keeper layer having a second anisotropy orthogonal to the first anisotropy, wherein a spin torque current is reduced by the reduction of the first plane anisotropy.

11. The magnetic random access memory device of claim 10 wherein the keeper layer comprises a plurality of magnetic layers separated by nonmagnetic spacer layers.

12. The magnetic random access memory device of claim 11 wherein the magnetic layers comprise alternating layers of one of a) cobalt and platinum, and b) cobalt and palladium and c) cobalt and nickel.

13. The magnetic random access memory device of claim 11 wherein the magnetization of each magnetic layer is approximately equal in magnitude and opposite in direction to the magnetization of the adjacent magnetic layer.

14. The magnetic random access memory device of claim 11 wherein each spacer layer produces antiferromagnetic exchange coupling between the magnetic layers.

15. The magnetic random access memory device of claim 10 wherein the keeper layer is magnetostatically coupled, and exchange decoupled, from the free layer.

16. The magnetic random access memory device according to claim 10 further comprising a spacer layer positioned between the keeper layer and the free magnetic element.

17. The magnetic random access memory device of claim 11 wherein the spacer layer comprises an electrically conducting non-magnetic material.

* * * * *